United States Patent [19]

Lindquist

[11] Patent Number: 5,113,168
[45] Date of Patent: May 12, 1992

[54] SINGLE POSITION FLAT MOUNT FUSE HOLDER

[75] Inventor: Carl E. Lindquist, Bridgewater, N.J.

[73] Assignee: San-O Industrial Corporation, Holbrook, N.Y.

[21] Appl. No.: 722,610

[22] Filed: Jun. 26, 1991

[51] Int. Cl.⁵ .................... H01H 85/02; H01H 85/30
[52] U.S. Cl. .................................. 337/187; 337/265; 337/216; 361/405; 361/430; 439/622
[58] Field of Search ............... 337/186, 187, 188, 208, 337/209, 210, 216, 256, 265; 361/400, 403, 404, 405, 430, 431, 432; 439/620, 621, 622, 62, 79, 80, 205, 206, 741, 743

[56] References Cited

U.S. PATENT DOCUMENTS 3,190,987 6/1965 Fister .................................. 337/261
4,864,079 9/1989 Barlow ............................... 361/405

Primary Examiner—Harold Broome

[57] ABSTRACT

A fuse holder for flat mounting on the edge surface of a printed circuit board comprises a compartment for receiving a fuse assembly; coterminous contact pins which are locked in position and which can be inserted in corresponding apertures on the surface of the board and two locating bosses for anchoring the fuse holder on the board when the pins are inserted in said apertures and soldered.

4 Claims, 1 Drawing Sheet

SINGLE POSITION FLAT MOUNT FUSE HOLDER

FIELD OF THE INVENTION

This invention relates generally to fuse holders and is particularly related to single position, flat mount fuse holders. More specifically, this invention relates to such fuse holders which can be laid flat on their sides and mounted on the edge of a printed circuit board (PCB) in order to occupy minimal space.

BACKGROUND OF THE INVENTION

It is common practice to protect printed circuit boards from damage caused due to overload current by installing or mounting a fuse assembly on the board. For safety reasons, the fuse assembly is usually installed in a fuse holder and the fuse holder is mounted on, or snapped onto the board.

In a copending application of the present inventor filed concurrently herewith and entitled "Fuse Holder With Standoffs", there is described a fuse holder with standoffs and contact pins or leads for mounting on a PCB. The fuse holder described therein, and fuse holders in general, are mounted vertically on the PCB with the fuse holder leads or pins extending downwardly from the bottom of the fuse holder into corresponding apertures on the surface of the PCB, whereon they are soldered in position, and the surface mounted PCB is then inserted in the electronic device or equipment. It can be appreciated, however, that in small or miniaturized electronic devices, space restrictions are of paramount consideration. Accordingly, a vertically mounted fuse holder - PCB assembly can not be accommodated or fit into such miniaturized electronic devices.

It is therefore an object of this invention to provide a fuse holder designed to overcome the space limitations associated with vertically mounted fuse holder - PCB assemblies.

It is a further object of this invention to provide a fuse holder which is uniquely designed to be laid flat, i.e., flat mounted on the edge surface of the PCB thus minimizing the space required to accommodate the fuse holder - PCB assembly in miniaturized electronic devices.

It is also an object of this invention to provide such flat mounted fuse holder - PCB assemblies in which the fuse holder is rigidly secured onto the PCB by virtue of the unique design and construction of the fuse holder.

It is yet another object of this invention to provide a fuse holder having contact pins which are coterminous in order to facilitate insertion of the pins into corresponding apertures on the PCB surface.

The foregoing and other objects, features and advantages of the fuse holder of this invention will be more clearly appreciated from its ensuing detailed description and the accompanying drawings.

SUMMARY OF THE INVENTION

In accordance with the present invention, a fuse holder is provided for flat mounting on the edge of a printed circuit board in order to satisfy the minimum space requirements of electronic devices which accommodate fuse holder - PCB assemblies.

The fuse holder of this invention comprises a fuse holder body having a compartment for receiving a fuse assembly which has a fuse element with spaced contact terminals and an alarm spring normally attached to the fuse element. The fuse holder body is defined by two spaced apart, opposed parallel front side wall and rear side wall, two spaced apart, opposed parallel side edge walls and a bottom closure wall thereby forming said compartment or cavity in the fuse holder body. A pair of U-shaped members are disposed securely within said fuse holder compartment; one at one end of said cavity and the other near the other end thereof. Each of the U-shaped members is in the general form of a horseshoe clip and has a laterally extending arm which protrudes as respective contact pin through apertures in the front side wall of the fuse holder body. A metallic alarm contact plate is also disposed within said compartment abutting the inside surface of the side edge wall at said other end of said compartment and protruding though aperture in the bottom closure wall of the fuse holder body in the alarm contact pin. The aforesaid contact pins and alarm pin are twisted from about 45 to about 90 degrees as they protrude from the fuse holder body in order to lock said pins in position, and the alarm contact pin is then bent approximately 90 degrees relative to the horizontal plane of said bottom closure wall. The side contact pins and the alarm contact pin are preferably coterminous.

The fuse holder body is also provided at its front side wall with two spaced bosses, which serve to position and anchor the fuse holder body in respective apertures on the PCB surface while the contact pins are being soldered on the PCB.

BRIEF DESCRIPTION OF THE DRAWINGS

In the drawings, wherein like reference numerals are employed to designate like parts.

DETAILED DESCRIPTION OF THE INVENTION

Figure 1:
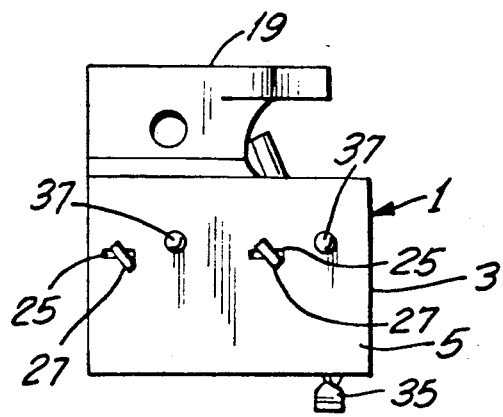
FIG. 1 is a front side elevational view of the fuse holder of the present invention with a fuse assembly mounted therein.
Figure 3:
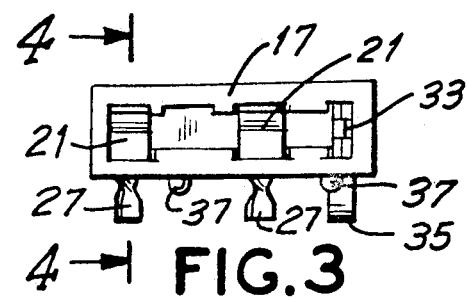
FIG. 3 is a top view of the fuse holder shown in FIG. 1.

Referring first to FIGS. 1-5 of the drawings, there are shown a fuse holder generally designated by reference numeral 1 comprising a fuse holder body 3 usually fabricated (e.g., by molding) from a suitable plastic. Preferably the fuse holder body 3 is made of polyphenylene sulfide (PPS), available from Phillips Chemical Division of Phillips Petroleum Company under the trademark Ryton. This polymer is particularly suitable due to its desirable electrical insulative properties and high deflection temperature. Other plastics with similar properties may be used, if desired.

Figure 5:
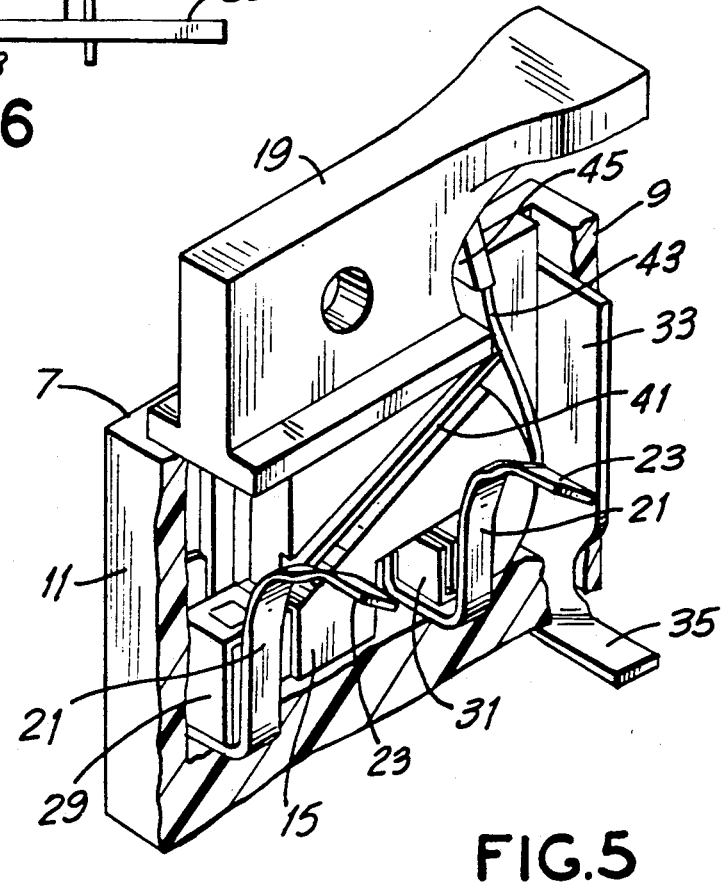
FIG. 5 is an elevational perspective view, partly in section, illustrating the fuse holder with a fuse assembly mounted therein.

The fuse holder body 3 comprises a pair of opposed, spaced-apart parallel front side and rear side walls or panels 5 and 7; a pair of opposed, spaced-apart parallel side edge walls or panels 9 and 11 and a bottom closure 13. The space between said walls and bottom closure wall define a compartment or cavity 15 which is open at the top of the fuse holder body 3 as shown at 17. The fuse holder cavity 15 is adapted to receive a fuse assembly 19 as shown in FIGS. 1 and 5. The fuse assembly 19 may be molded out of a plastic material similar to the plastic used for fabricating the fuse holder body 3 and is sized and configured to fit snugly within the fuse holder compartment 15.

Within the fuse holder compartment 15 are secured a pair of generally U-shaped metallic members 21, 21, each in the general form of a horseshoe clip. Each of said U-shaped members 21, 21 has an integral, horizontally extending arm 23, 23 which protrudes from the front side wall 5, e.g., through the rectangular slots 25, 25 in said wall, and twisted approximately 45 degrees to form the contact leads or pins 27, 27 in order to lock them in position. The U-shaped members 21, 21 are adapted to engage the load terminal 29 and the battery terminal 31 of the fuse assembly 19 as shown in FIG. 5.

Within the fuse holder compartment 15, there is also provided a metallic alarm contact plate 33 abutting the inside surface of the side edge wall 9. The metallic contact plate 33 protrudes from the bottom closure wall 13, e.g., through a rectangular slot therein (not shown). After protruding from said bottom closure wall 13, the contact plate 33 is twisted approximately 45 degrees and then bent approximately 90 degrees to form the alarm contact pin or lead 35 which is locked in position.

It is important that the lead pins 27, 27 be twisted in order to lock them in position as aforesaid. If not twisted, they tend to recoil into the fuse holder body cavity 15 when said leads and contact pin are inserted into corresponding holes in the surface of the PCB, and soldered. Consequently, the fuse assembly 19 will not fit into said fuse holder cavity. The degree of twisting of said two contact pins may vary from about 45 to about 90 degrees, the exact degree of twisting per se not being critical in this invention.

Figure 2:
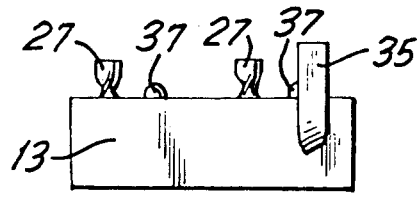
FIG. 2 is a bottom view of the fuse holder shown in FIG. 1.
Figure 4:
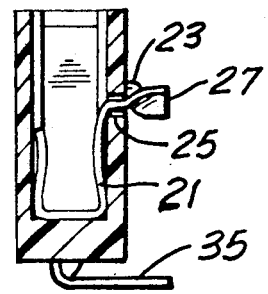
FIG. 4 is a view taken along the line 4—4 in FIG. 3.

In order to further enhance secure mounting of the fuse holder body 3 onto the surface of the PCB, the fuse holder body 3 is provided with a pair of spaced apart locating bosses 37, 37 on the front side wall 5 as shown in FIGS. 1, 2 and 4. The provision of the locating bosses 37, 37 is important since they are inserted, by pressure fitting, through corresponding located apertures in the surface of the PCB, in order to securely anchor the fuse holder body 3 in position while soldering the contact pins onto the surface of the PCB. Additionally, the bosses 37, 37 provide two locating points which serve to align the fuse holder bodies where several fuse holders are mounted on a PCB such that they are lined up along the edge of the PCB.

Figure 6:
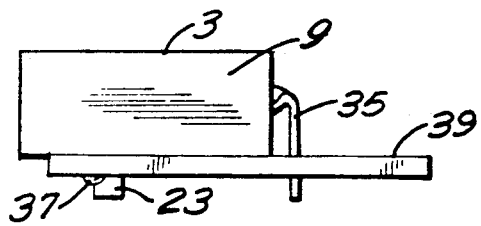
FIG. 6 is front side view of the fuse holder of the present invention mounted on the edge of a printed circuit board.

In use, the fuse holder 1 is mounted on the surface of PCB 39 as shown in FIG. 6. By inserting (snug fitting) the locating bosses 37, 37 into corresponding apertures (not shown) on the surface of the PCB, the fuse holder body 3 is securely anchored in place. The contact pins 23, 23 are inserted in corresponding apertures (not shown) on the surface of the PCB and soldered in position. Either before or after mounting the fuse holder on the PCB, the fuse assembly 19 is inserted into their respective fuse holder compartment 19 wherein the load contact terminal 29 and the battery contact terminal 31 are engaged into the U-shaped members 21, 21. When an overload current flows through the fuse, the fuse element 41 melts or ruptures thus releasing the alarm spring 43 which impacts on the metallic contact plate 33 and thus triggers the alarm through the contact pin 35 which is electrically connected to the alarm circuit through the PCB. A color coded bead 45 at the top of the alarm spring 43 indicates the current rating of the fuse and is visible from the outside (top) of the fuse holder.

Although the invention has been described and illustrated with a certain degree of particularly, several obvious changes and modifications are suggested from the description herein. Such changes and modifications are nevertheless within the scope of the present invention.

What is claimed is:

1. A single position fuse holder for flat mounting on an edge surface of a printed circuit board, said fuse holder comprising a fuse holder body portion made of an electrically insulative material and formed of two spaced apart, opposed parallel front side wall and rear side wall; two spaced apart, opposed parallel side edge walls, and a bottom closure wall thereby defining a compartment in said fuse holder body for receiving a fuse assembly having a fuse element with spaced contact terminals and an alarm spring normally attached to the fuse element; a pair of generally U-shaped members in said fuse holder compartment, one at one end of said compartment and the other near the other end thereof, a metallic alarm contact plate in said fuse holder compartment abutting the inside surface of the side edge wall at said other end of said compartment, each of said generally U-shaped members having a laterally extending arm portion which protrudes through corresponding rectangular apertures in said front side wall forming respective side contact pins and twisted from about 45 to about 90 degrees to lock said pins in position, and wherein said metallic alarm contact plate protrudes through a corresponding rectangular aperture in said bottom wall closure forming an alarm contact pin which is twisted from about 45 to about 90 degrees to lock said pin in position, and thereafter bent approximately 90 degrees relative to said bottom closure wall.

2. A fuse holder as in claim 1 wherein said front side wall of said fuse holder body portion is provided with a pair of spaced apart bosses adapted for pressure fitting into corresponding apertures on the surface of a printed circuit board for locating and anchoring said fuse holder body on said printed circuit board.

3. A fuse holder as in claim 1 wherein said contact pins are coterminous.

4. A fuse holder as in claim 2 wherein said contact pins are coterminous.

* * * * *